MULTIPLE STAGE DIRECT CROSS-COUPLED AMPLIFIER

Filed Oct. 17, 1968 2 Sheets-Sheet 1

INVENTOR.
WILLIAM Z. JOHNSON
BY
Schroeder, Siegfried & Ryan
ATTORNEYS

MULTIPLE STAGE DIRECT CROSS-COUPLED AMPLIFIER

Filed Oct. 17, 1968 2 Sheets-Sheet 2

INVENTOR.

WILLIAM Z. JOHNSON

BY

Schroeder, Siegfried & Ryan

ATTORNEYS

United States Patent Office 3,538,447

Patented Nov. 3, 1970

3,538,447
MULTIPLE STAGE DIRECT AND CROSS-COUPLED AMPLIFIER

William Z. Johnson, 2900 Douglas Drive N., Apt. 337, Minneapolis, Minn. 55422; assignor to said Johnson, New Brighton, Minn.

Filed Oct. 17, 1968, Ser. No. 768,460
Int. Cl. H03f 3/26
U.S. Cl. 330—15 8 Claims

ABSTRACT OF THE DISCLOSURE

An electronic amplifying apparatus which includes three stages of multi-element electric conducting valves connected in push-pull configuration. The first stage is directly coupled to the second stage which has a low impedance output. The third stage is directly coupled to the second stage and includes a cross-coupling connection between the second and third stages to give improved push-pull characteristics.

This invention relates to an electronic amplifying apparatus and more particularly to an improved electronic amplifier of the direct and cross-coupled type.

Electronic amplifying equipment of the push-pull circuitry type is well known and in use. Further, such circuitry has previously used direct coupling between stages. Previously, cross-coupling in push-pull amplifiers has been employed for balance purposes. In my amplifying circuitry a plural stage amplifier in push-pull configuration is provided in which the first stage is directly coupled to a second stage having a low impedance output and with the second stage being cross-coupled to the third stage in a push-pull configuration. This improved amplifying circuitry is applicable to electron tubes of the triode, tetrode or pentode type and is also applicable to solid state devices such as field effect or bipolar transistors. It substantially eliminates distortion and provides extremely good cross-coupling with very low phase shift at low frequencies and with relative insensitivity to supply voltage variations. Further, it provides for large push-pull output signals with circuit balance being maintained at or over the entire frequency spectrum.

Therefore, it is the principal object of this invention to provide an improved direct and cross-coupled amplifier.

Another object of this invention is to provide in an amplifier of this type, a circuit arrangement which provides a minimal or controlled phase shift with a large output signal having low distortion and circuit balance at all frequencies.

A further object of this invention is to provide a circuitry of this type adapted for single input operation.

These and other objects of this invention will become apparent from the reading of the attached description together with the drawings wherein.

Figure 1:
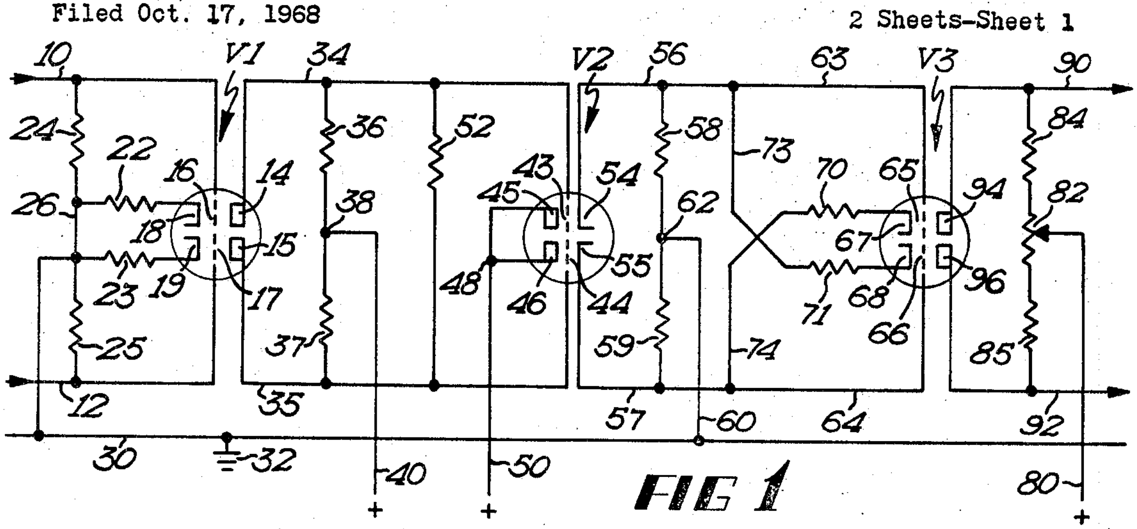
FIG. 1 is a schematic circuit diagram of one embodiment of the invention.

My improved amplifying device of the direct and cross-coupled type is shown in the drawings as utilizing dual triodes, identified at V–1, V–2 and V–3 for the plural stages of the amplifier which are connected in a push-pull configuration. It will be understood, however, that any multi-element vacuum tube or semi-conductor may be utilized for this purpose. In FIG. 1, the input circuit is evidenced by conductors 10 and 12 with the tube V–1 including plates 14 and 15, grids 16, 17 and cathodes 18 and 19, respectively. The grids 16 and 17 are connected respectively to the conductors which form the input conductors 10 and 12 and the cathodes 18 and 19 are connected through bias resistors 22, 23 to the midpoint of voltage dividing resistors 24, 25 respectively which are connected to common at one extremity and in a series circuit between the input conductors 10 and 12 at the other extremity. The midpoint or common side, as evidenced by the conductor 26, connects to a common conductor 30 which may be grounded, such as is indicated at 32. Plate elements 14 and 15 of the dual triode in FIG. 1 are connected through conductors 34, 35 and load resistors 36, 37, respectively, to a common point 38 which in turn is connected to a D–C voltage supply, indicated at 40. The amplifying stage of V–1 is conventionally connected to produce an output from the plates 14, 15 and this output circuit, as evidenced by the conductors 34, 35 is directly coupled to grids 43, 44 of the dual triode V–2. This stage has its plates 45, 46 connected in common through a conductor 48 and to a D–C power supply, as indicated by the conductor 50. This may or may not be at the same voltage level as the power supply conductor 40. The output circuit may or may not include a load resistor, such as is indicated at 52, which is connected between the conductors 34, 35. The dual triode V–2 is connected in a cathode follower arrangement. Its cathodes 54, 55 provide an output circuit through conductors 56, 57 and load resistors 58, 59. The load resistors are connected across the conductors 63, 64 and through a conductor 60 at a common point 62 of the resistors and to the common conductor. The output voltage from the cathodes are directly coupled through conductors, 63, 64 to grids 65, 66 respectively of the dual triode V–3. The dual triode V–3 has cathodes 67, 68 respectively, connected through bias resistors 70, 71 and conductors 73, 74 to the opposite cathodes of the dual triode V–2 in a cross-coupling circuit. The dual triode V–3 is energized from a B+ or D–C power supply, indicated by conductor 80, which is connected to a voltage balancing resistor 82 and to load resistors 84, 85 and output conductors 90, 92, respectively, with the output conductors leading to the plates 94, 96 of the dual triode V–3. The output conductors 90, 92 provide the output circuit.

In this embodiment, the dual triode V–1 operates as a plate loaded dual triode in push-pull circuit configuration. The dual triode V–2 is directly connected thereto and functions as a conventional cathode follower operating with a significant voltage above ground. It provides a low impedance drive or output so that the dual triode V–3 may be directly connected thereto and in a cross-coupled manner without loading effect on V-1. This improved circuit will provide for very low phase shift at low frequencies while providing extremely good push-pull coupling between the stages. It is relatively insensitive to supply voltage variations and is such that circuit balance is maintained at all frequencies. It provides a large push-pull output signal with low distortion to provide an improved overall amplifier performance.

Figure 2:
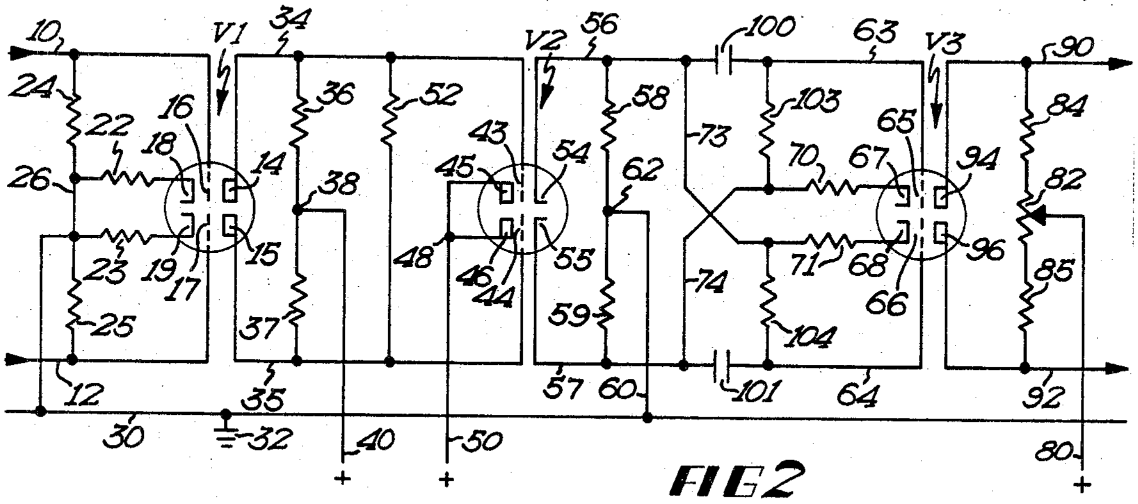
FIG. 2 is a schematic circuit diagram of another embodiment of the invention.

The embodiment shown in FIG. 2 provides for alternating current coupling of the V–3 stage to the V–2 stage. The first and second, or V–1 and V–2 stages of the amplifier are unchanged and the elements of the circuit are numbered as in FIG. 1 for simplicity. In the output circuit of the V–2 stage, the cathodes 54, 55 of the dual triode are connected through the output conductors 56, 57 and conductors 63, 64 to the grids 65, 66 of the dual triode V–3 through condensers 100, 101, respectively. Appropriate bias resistors 103, 104 connected to the input conductors 63, 64 of the dual triode are connected at their opposite extremities to the bias resistors 70, 71 leading to the cathodes 67, 68 of the dual triode V–3. Because of the cross-coupling, the output of the dual triode V–2 to the cathodes of the dual triode V–3 cannot completely eliminate the direct current portion of the signal in the coupling. However, since the grid to cathode relationship in stage V–3 is not now dependent upon near perfect D-C balances as in the preceding circuitry, less critical overall circuit parameters exist for an A-C coupled version.

Figure 3:
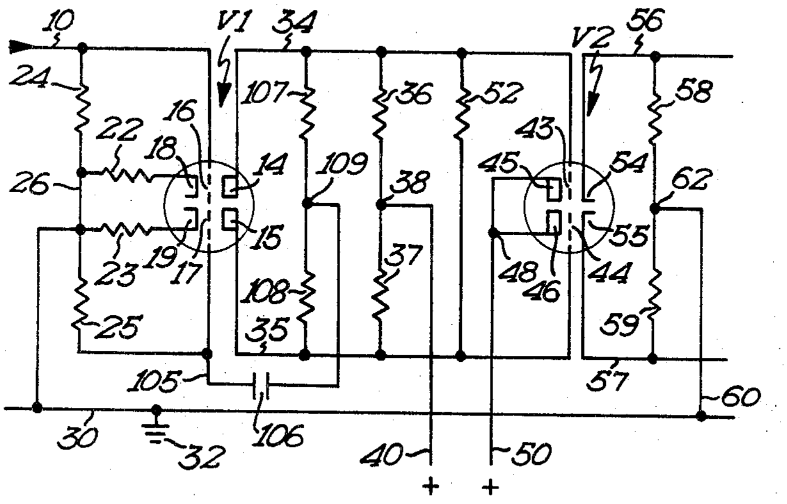
FIG. 3 is a schematic circuit diagram of a modification of the input circuits for the embodiments shown in FIGS. 1 and 2.

The modification of the circuits of FIGS. 1 and 2, as shown in FIG. 3, permits single ended A-C input to this amplifying circuit. Class B or push-pull operation is provided in the first or initial stage. As will be seen from the drawing, input lead or conductor 12 eliminated, and grid 17 is connected through the conductor 105 and a condenser 106 to the midpoint 109 of a pair of signal voltage dividing resistors 107, 108 connected at their extremities to the output conductors 34, 35 common to the plates 14, 15 of the dual triode. This causes the plate 15, grid 17 and cathode 19 section of the tube V–1 to act more or less as a plate follower, providing relatively good A–C balance with low distortion. Other essential characteristics of the circuit are essentially the same as in FIG. 1 or 2.

Figure 4:
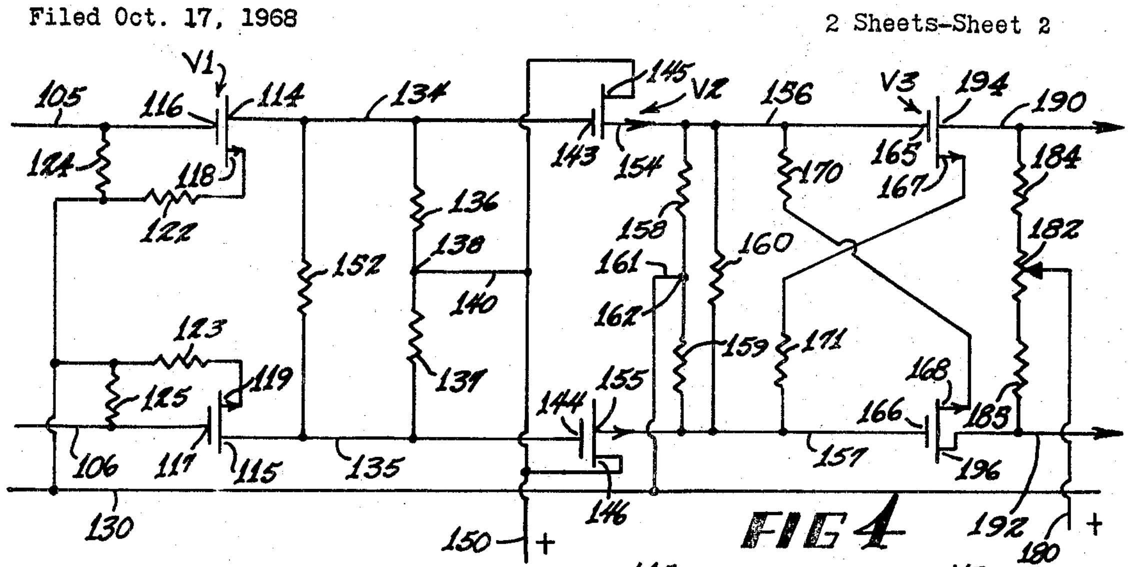
FIG. 4 is a schematic circuit diagram of a further embodiment of the invention using field effect transistors.

The embodiment of the invention shown in FIG. 4 is a variation of the direct and cross-coupled amplifier circuit showing the use of field effect transistors in a balanced voltage amplifier which is D-C coupled. The three stages of the amplifier, namely V–1, V–2 and V–3 utilize field effect transistors with the input to the first stage being connected through conductors 105, 106 to gate electrodes 116, 117 of the first pair of transistors. The drain electrodes 114, 115 of the first pair receive their energization through conductors 134, 135 and voltage bias resistors 136, 137 which are connected at a common point 138 and through a conductor 140 to a B+ power supply evidenced by conductor 150. The source electrodes 118, 119 of the first stage are connected respectively through bias resistors 122, 123 to a common point and a common conductor 130 with additional bias resistors 124, 125 connected respectively between the gate electrodes and this common circuit. The output circuit, as evidenced by the conductors 134, 135 of the first stage, may or may not include a load resistor, such as is indicated at 152, connected between the conductors 134, 135. The second stage of the amplifier, as evidenced by the pair of transistors V–2, have their respective gate electrodes 143, 144 directly connected to the first stage at the output conductors 134, 135. Similarly, the drain electrodes 145, 146 of this stage are connected and energized from the source conductor 150. The source electrodes 154, 155, respectively, of this stage are connected through load resistors 158, 159 which connect in a common point 162 and through a conductor 161 to the common conductor 130. A further load or balancing resistor 160 may be connected across the output conductors 156, 157 common to the source electrodes 154, 155 if desired. This second stage provides a low impedance or source follower output which will be directly coupled through the third stage of the amplifier, as evidenced by the pair of field effect transistors identified at V–3. The gate electrodes 165, 166 of the third stage are directly connected to the output conductors 156, 157 for the second stage and a cross-coupling between the source electrodes for the respective transistors is provided as in the case of the triodes shown in FIG. 1. Thus, source electrode 167 is connected through a bias resistor 171 to the conductor 157 while the source electrode

168 is connected through the bias resistors 170 to the output conductor 156 common to the gate electrode of the other of the pair of field effect transistors. The output circuit is taken from the drain electrodes 194, 195 of the third stage through conductors 190, 192 and these drain electrodes are also connected through load resistors 184, 185 with a common load potentiometer 182 connected thereto and to a second D-C voltage source indicated by conductor 180.

In operation, this version of the direct and cross-coupled amplifier is substantially identical with that of FIG. 1 except for the type of multi-element electric conducting devices utilized therein. The characteristics of a push-pull amplifier are retained and the second stage provides a low impedance drive or output to the third stage which is directly coupled thereto and in a cross-coupled manner without loading on the preceding stage. This improved circuit provides very low phase shift at low frequencies with extremely good push-pull coupling between the stages. It is largely insensitive to supply voltage variations and circuit balance is maintained therein at all frequencies.

Figure 5:
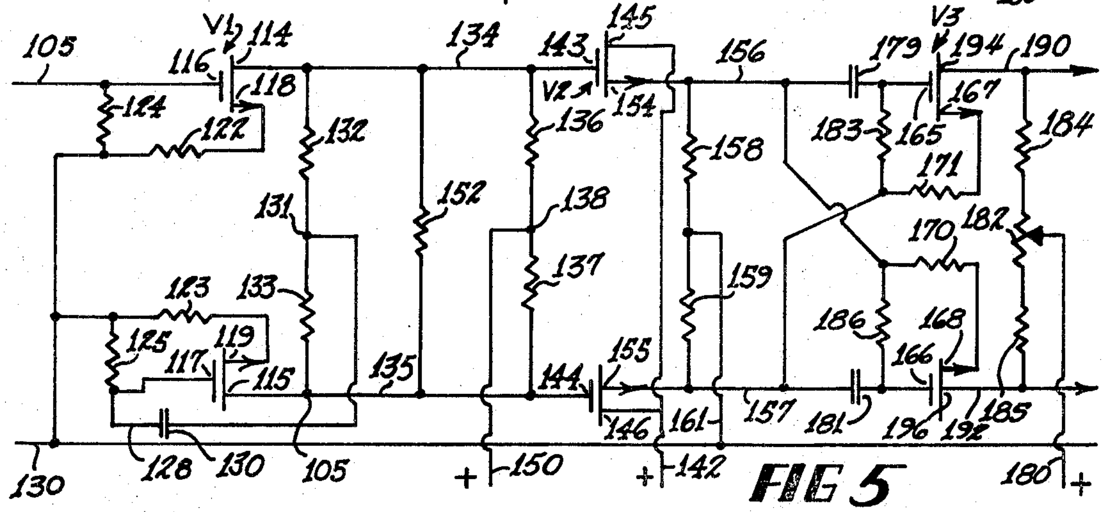
FIG. 5 is a schematic circuit diagram of another embodiment of the invention using field effect transistors with a modified input circuit.

The embodiment of the circuit shown in FIG. 5 is substantially identical to that shown in FIG. 2 with the exception that field effect transistors are substituted as the multi-element electric devices for the dual triodes shown for the stage V–1, V–2 and V–3 of the amplifier. This circuit employs the single ended input version of FIG. 3 with the balanced output and the A-C coupling version of the circuit of FIG. 2 for the dual triodes. Where the elements are the same as in FIG. 4, they were similarly numbered. The single ended input is evidenced by the input conductor 105 which is connected directly to the gate electrode of one of the field effect transistors forming the stage V–1. A suitable bias resistor 124 is connected between the input conductor and the ground conductor 130 for this transistor. The drain electrodes 114, 115 of the transistors are connected to the output conductors 134, 135 and through load resistors 136, 137, respectively, which are connected in common and to the B+ source conductor 150. A suitable load resistor 152 may or may not be connected across the output conductors 134, 135. The gate electrode 117 is connected through a conductor 128 and condenser 130 to the midpoint 131 of a pair of signal voltage dividing resistors 132, 133 connected at their extremities to the output conductors 134, 135 common to the drain electrodes 114, 115 of the transistors forming the stage V–1. The source electrodes 118, 119 are connected respectively through bias resistors 122, 123 to the common conductor 130 and a similar bias resistor 125 is connected between the gate electrode 117 and the common conductor. As in the case of the dual triodes, the single input connection for the transistors connected in a push-pull relationship provides for energization for the gate electrode 117 from the output signals similar to the plate follower arrangement shown in FIG. 3 for the dual triodes. This provides relatively good A-C balance with low distortion.

The second stage V–2 shows the field effect transistors making up the same but connected in a push-pull relationship with the gate electrodes 143, 144 connected to the output conductors 134, 135. The drain electrodes 145, 146, respectively, are connected to the energizing source conductor 142 and the source electrodes 154, 155 are connected to the output conductors 156, 157 to provide the low impedance output circuit configuration. Load resistors 158, 159 are connected across the output conductors and their common extremity is connected through the conductor 161 to the common conductor 130. In the third stage of the amplifier, an A-C coupling is provided for the gate electrodes 165, 166 of the transistors. Thus, coupling condensers 180, 181 connect the gate electrodes 165, 166 to the output conductors 156, 157 with the drain electrodes 194, 196 being connected through load resistors 184, 185 and a voltage adjusting resistor 182 connected between the load resistors and to the source conductor 180. The output conductors 190, 192 are common to the drain electrodes as in the beforementioned embodiment. The source electrodes 167, 168, respectively, are connected through resistors 171, 170, respectively, to the output conductors 157, 156 of the second stage of amplifier in the cross-coupling circuit configuration. In addition, bias resistors 183, 186 are connected to the gate electrodes 165, 166 and to the conductors forming the cross-coupling circuit configuration. In this embodiment, single ended input to the stage V–1 which is connected in a push-pull configuration provides energization through a direct coupling to the stage V–2 of the field effect transistors. The latter are connected in a low impedance or source follower type output circuit and the output therefrom is coupled through condensers to the gate electrode of the third stage and cross-coupled to the source electrodes of the transistors forming the opposite side of the push-pull circuit in a cross-coupling configuration. As in the case of the triode circuit of FIG. 2, the cross-coupling configuration provides a slight direct current signal to the gate electrodes because of the cross-coupling connection. However, the gate to source electrode relationship of these transistors are not dependent on a near perfect D-C balance as in the preceding stage and less critical overall circuit parameters exist for this A-C version of the circuit.

Figure 6:
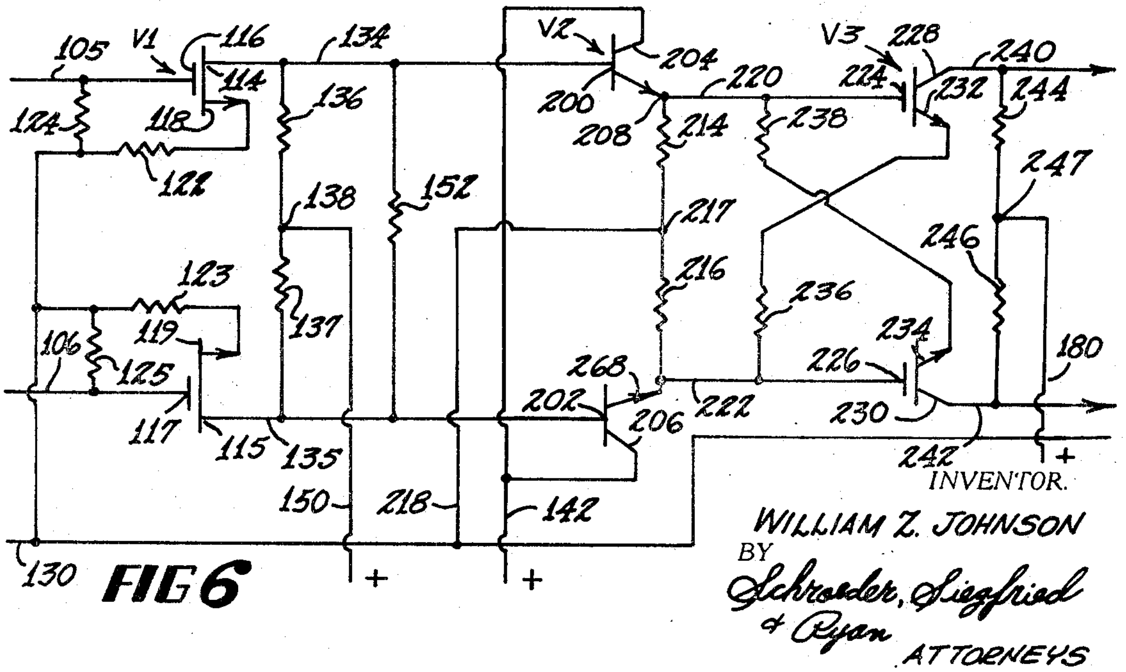
FIG. 6 is a schematic circuit diagram of a modification of the embodiment of the invention shown in FIG. 4 using a combination of field effect and bipolar transistors.

The modification or embodiment shown in FIG. 6 combines the use of field effect transistors and bipolar or NPN type transistors in a D-C coupled balanced amplifier. The three stages of the amplifier, namely V–1, V–2 and V–3 are similar to the version shown in FIG. 4 in that they employ a double ended input D-C coupled amplifier with the first stage utilizing the field effect transistors in a push-pull relationship and the second and third stages utilizing bipolar transistors in push-pull relationship in place of the field effect transistors. Thus, as in FIG. 3, the input circuit 105, 106 is coupled to the gate electrodes 116, 117 of the field effect transistors with the drain electrodes 114, 115 being connected to the output circuit or conductors 134, 135 and load resistors 136, 137 connected thereto with the common point 138 of the load resistors being connected to the source conductor 150. The gate electrodes 116, 117 are similarly connected through bias resistors 124, 125 to a common point and the common conductor 130 with the source electrodes 118, 119 being connected through bias resistors 122, 123 to the common conductor. The load resistor 152 may be connected across the output conductors 134, 135 for loading purposes. The output of the first stage V–1 is connected through the output conductors 134, 135 to the bases 200, 202, respectively, of the NPN or bipolar transistors forming the stage V–2 and connected in a push-pull relationship. The collector electrodes 204, 206 of these transistors are connected to the supply or B+ conductor 142 and the emitters 208, 210 are connected through load resistors 214, 216 to a common point 217 and the conductor 218 to the common conductor 130. The output conductors 220, 222 are connected to the emitters for the emitter follower relationship or circuit with the output being directly coupled to the bases 224, 226 of the transistors forming the stage V–3. These are NPN or bipolar transistors whose collectors 228, 230 are connected to the output conductors 240, 242 and through load resistors 244, 246 connected at one extremity to the output conductors and in common at 247 to the B+ conductor 180. The emitters 232, 234 of the bipolar transistors forming the stage V–3 are coupled or connected through bias resistors 236, 238 to the output circuit 220, 222 of the stage V–2 in a cross-coupled relationship. Thus, the emitter 232 is connected through its bias resistor to the conductor 222, which output conductor is common to the base 226 forming the other half of the push-pull circuit configuration for stage V–3. Similarly, the emitter 234 is connected through its bias resistor to the conductor 220 which is common to the base 224 of the opposite transistor to form the cross-coupling circuit configuration.

This embodiment operates in the manner of a direct and cross-coupled amplifier in which the double ended input to the first stage is amplified through the field effect transistors in push-pull relationship and directly coupled to the bases of the stages V–2 formed by the bipolar transistors in push-pull circuit relation and connected in an emitter follower circuit configuration to provide the low impedance output. The output of this stage is directly coupled to the bases of the third stage and cross-coupled to the emitters of the third stage without any loading on the first stage. As in the preceding embodiments, the improved circuit will provide a very low phase shift at low frequencies with extremely good push-pull coupling between the stages such that it is relatively insensitive to supply voltage variations and maintains circuit balance at all frequencies. Further, the improved circuits of this and the other embodiments provide a large push-pull signal with low distortion to provide improved overall amplifier performance.

In considering this invention, it should be remembered that the present disclosure is intended to be illustrative only and the scope of the invention should be determined by the appended claims.

What is claimed is:

1. A direct and cross-coupled amplifier comprising a direct current voltage source, a reference connection connected to a point of reference potential, and three amplifier stages, each comprising a pair of multi-electrode electronic control devices having two output electrodes and a control electrode, the first of said amplifier stages comprising a pair of series connected output resistors, and means connecting said voltage source, the pair of electronic control devices in said stage, said output resistors and said reference connection in a push-pull relationship with said voltage source being connected to the junction of said output resistors and the opposite terminals of said output resistors being connected to corresponding output electrodes of said electronic devices, the second of said amplifier stages comprising connection between the opposite terminals of the load resistors of said first stage and the control electrodes of the pair of electronic control devices of said second stages, a pair of series connected output resistors, and means connecting said voltage source, said pair of electronic control devices in said second stage, said output resistors, and said reference connection in a push-pull relationship of a voltage follower type with a low impedance output, the junction of said two output resistors being connected to said reference connection and the opposite or outer terminals of said resistors being connected to corresponding ones of said output electrodes of said electronic devices, the other output electrodes of said devices being connected to said direct current voltage source, and the third of said stages being cross-coupled to said second stage, said third stage having an input circuit for each of the pair of electronic devices in said stage, each input circuit extending between opposite terminals of said series connected output resistors of said second stage and the control electrode and one of the output electrodes of the associated device, the control electrode of one of said electronic devices and the one output electrode of the other of said devices being connected to the outer terminal of one of said output resistors and the control electrode of the other device and the one output electrode of said first named device being connected to the outer terminal of the other of said output resistors, said third stage having a further pair of output impedances connected between the other output electrodes of said electron devices and the source of voltage being connected to the junction of said last named output impedances.

2. The amplifier of claim 1 in which the multi-electrode control devices are electronic space discharge devices in each of which the output electrodes are an anode and cathode and the control electrode is a grid.

3. The amplifier of claim 2 in which the second of said stages is a cathode follower stage in which the opposite or opposite terminals of said two output resistors of said stage are connected to the cathodes of said space discharge devices.

4. The amplifier of claim 1 in which the multi-electrode electronic control devices are semi-conductor devices.

5. The amplifier of claim 4 in which the semi-conductor devices are field effect transistors in each of which the output electrodes are a drain electrode and a source electrode and the control electrode is a gate electrode.

6. The amplifier of claim 1 in which the first of said stages comprises a phase-splitter circuit to enable an input signal to be applied to the control electrodes of both electronic control devices from a single-ended A-C input signal voltage.

7. The amplifier of claim 1 in which the connection to the control electrode of each electronic control device of the third of said stages includes an A-C coupling means which effectively blocks any D-C component of the output of said second stage.

8. The amplifier of claim 7 in which the A-C coupling means is a capacitor and in which there is a bias resistor connected between the control electrode and said one output electrode of each of said electronic devices.

References Cited

UNITED STATES PATENTS

| | | | |
|---|---|---|---|
| 2,715,202 | 8/1955 | Turner et al. | 330—119 X |
| 2,768,250 | 10/1956 | Stachura | 330—121 X |
| 3,405,367 | 10/1968 | Engelhardt | 330—15 X |

ROY LAKE, Primary Examiner

J. B. MULLINS, Assistant Examiner

U.S. Cl. X.R.

330—20, 119, 121